United States Patent
Basceri et al.

(10) Patent No.: US 6,884,296 B2
(45) Date of Patent: Apr. 26, 2005

(54) REACTORS HAVING GAS DISTRIBUTORS AND METHODS FOR DEPOSITING MATERIALS ONTO MICRO-DEVICE WORKPIECES

(75) Inventors: Cem Basceri, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 185 days.

(21) Appl. No.: 10/226,573

(22) Filed: Aug. 23, 2002

(65) Prior Publication Data

US 2004/0035358 A1 Feb. 26, 2004

(51) Int. Cl.[7] ................... C23C 16/00; C23C 16/455; C23F 1/00; H01L 21/306
(52) U.S. Cl. ............ 118/715; 156/345.29; 156/345.33; 156/345.34
(58) Field of Search .................. 118/715; 156/345.29, 156/345.33, 345.34

(56) References Cited

U.S. PATENT DOCUMENTS

| 579,269 A | 3/1897 | Hent |
| 4,966,646 A | 10/1990 | Zdeblick |
| 5,091,207 A | 2/1992 | Tanaka |

(Continued)

FOREIGN PATENT DOCUMENTS

| JP | 2002-164336 | 6/2002 |
| SU | 197803 | * 8/1974 |

OTHER PUBLICATIONS

A.K. Henning et al. "Microfluidic MEMS for Semiconductor Processing," IEEE Transactions on Components, Packaging, and Manufacturing Technology B21, pp. 329–337 (1998).

A.K. Henning, "Microfluidic MEMS," Proceedings: IEEE Aerospace Conference, Paper 4.906 (IEEE Press, Picataway, NJ, 1998).

J.S. Fitch et al., "Pressure–Based Mass–Flow Control Using Thermopneumatically–Actuated Microvalves," Proceedings: Solid–State Sensor and Actuator Workshop, pp. 162–165 (Transducers Research Foundation, Cleveland, OH, 1998).

(Continued)

*Primary Examiner*—Jeffrie R. Lund
(74) *Attorney, Agent, or Firm*—Perkins Coie LLP (57) ABSTRACT

Reactors having gas distributors for depositing materials onto micro-device workpieces, systems that include such reactors, and methods for depositing materials onto micro-device workpieces are disclosed herein. In one embodiment, a reactor for depositing material on a micro-device workpiece includes a reaction chamber and a gas distributor in the reaction chamber. The gas distributor includes a first gas conduit having a first injector and a second gas conduit having a second injector. The first injector projects a first gas flow along a first vector and the second injector projects a second gas flow along a second vector that intersects the first vector in an external mixing zone facing the workpiece. In another embodiment, the mixing zone is an external mixing recess on a surface of the gas distributor that faces the workpiece.

54 Claims, 6 Drawing Sheets

U.S. PATENT DOCUMENTS

| | | | |
|---|---|---|---|
| 5,380,396 A | | 1/1995 | Shikida et al. |
| 5,500,256 A | | 3/1996 | Watabe |
| 5,522,934 A | * | 6/1996 | Suzuki et al. ......... 118/723 AN |
| 5,589,002 A | * | 12/1996 | Su .......................... 118/723 E |
| 5,624,498 A | | 4/1997 | Lee et al. |
| 5,792,269 A | | 8/1998 | Deacon et al. |
| 5,846,330 A | | 12/1998 | Quirk et al. |
| 5,865,417 A | | 2/1999 | Harris et al. |
| 5,953,634 A | | 9/1999 | Kajita et al. |
| 6,032,923 A | | 3/2000 | Biegelsen et al. |
| 6,062,256 A | | 5/2000 | Miller et al. |
| 6,070,551 A | | 6/2000 | Li et al. |
| 6,080,446 A | | 6/2000 | Tobe et al. |
| 6,086,677 A | | 7/2000 | Umotoy et al. |
| 6,123,107 A | | 9/2000 | Selser et al. |
| 6,129,331 A | | 10/2000 | Henning et al. |
| 6,149,123 A | | 11/2000 | Harris et al. |
| 6,160,243 A | | 12/2000 | Cozad |
| 6,182,603 B1 | | 2/2001 | Shang et al. |
| 6,206,972 B1 | * | 3/2001 | Dunham ..................... 118/715 |
| 6,210,754 B1 | | 4/2001 | Lu et al. |
| 6,237,394 B1 | | 5/2001 | Harris et al. |
| 6,245,192 B1 | | 6/2001 | Dhindsa et al. |
| 6,287,980 B1 | | 9/2001 | Hanazaki et al. |
| 6,290,491 B1 | | 9/2001 | Shahvandi et al. |
| 6,302,964 B1 | | 10/2001 | Umotoy et al. |
| 6,358,323 B1 | | 3/2002 | Schmitt et al. |
| 6,432,256 B1 | * | 8/2002 | Raoux ..................... 156/345.1 |
| 6,432,259 B1 | * | 8/2002 | Noorbakhsh et al. .. 156/345.33 |
| 6,432,831 B1 | | 8/2002 | Dhindsa et al. |
| 6,444,039 B1 | | 9/2002 | Nguyen |
| 6,596,085 B1 | | 7/2003 | Schmitt et al. |
| 6,641,673 B1 | | 11/2003 | Yang |
| 6,704,913 B1 | * | 3/2004 | Rossman ....................... 716/4 |
| 6,705,345 B1 | | 3/2004 | Bifano |
| 6,706,334 B1 | * | 3/2004 | Kobayashi et al. ......... 427/534 |
| 2004/0003777 A1 | * | 1/2004 | Carpenter et al. ......... 118/715 |
| 2004/0035358 A1 | * | 2/2004 | Basceri et al. .............. 118/715 |
| 2004/0040502 A1 | | 3/2004 | Baceri et al. |
| 2004/0040503 A1 | | 3/2004 | Basceri et al. |
| 2004/0099377 A1 | * | 5/2004 | Newton et al. ........ 156/345.33 |

OTHER PUBLICATIONS

A.K. Henning et al., "Contamination Reduction Using MEMS–Based, High–Precision Mass Flow Controllers," Proceedings: SEMICON West Symposium on Contamination Free Manufacturing for Semiconductor Processing (SEMI, Moutain View, CA, 1998).

A.K. Henning, "Liquid and Gas–Liquid Phase Behavior in Thermopneumatically Actuated Microvalves," Proceedings: Micro Fluidic Devices and Systems, vol. 3515, pp. 53–63 (International Society for Optical Engineering, Bellingham, WA, 1998).

A.K. Henning et al., "Performance of MEMS–Based Gas Distribution and Control Systems for Semiconductor Processing," Proceedings: Micromachined Devices and Components, vol. 3514, pp. 159–170 (International Society for Optical Engineering, Bellingham, WA, 1998).

A.K. Henning et al, "Performance of MEMS–Based Gas Distribution and Control Systems for Semiconductor Processing," Proceedings: SEMICON West Workshop on Gas Distribution (SEMI, Mountain View, CA, 1998).

D. Maillefer et al., "A High–Performance Silicon Micropump for Disposable Drug Delivery Systems," Proceedings of the MEMS 2001 Conference, Interlaken Switzerland, pp. 413–417 (2001).

R. Bardell et al., "Designing High–Performance Micro–Pumps Based On No–Moving–Parts Valves," ASME—Microelectromechanical Systems (MEMS), DSC–vol. 62 HTD–vol. 354, pp. 47–53 (1997).

A. Olsson, "Valve–Less Diffuser Micropumps" (1998), <http://www.s3.kth.se/mst /research/dissertations/pdf/andersodoc.pdf>.

A.K. Henning et al., "A Thermopneumatically Actuated Microvalve for Liquid Expansion and Proportional Control," Proceedings: Transducers '97: 1997 International Solid State Sensors and Actuators Conference, pp. 825–828 (IEEE Press, Piscataway, NJ, 1997).

* cited by examiner

REACTORS HAVING GAS DISTRIBUTORS AND METHODS FOR DEPOSITING MATERIALS ONTO MICRO-DEVICE WORKPIECES

TECHNICAL FIELD

The present invention is related to reactors having gas distributors and methods for depositing materials in thin film deposition processes used in the manufacturing of micro-devices.

BACKGROUND

Thin film deposition techniques are widely used in the manufacturing of micro-devices to form a coating on a workpiece that closely conforms to the surface topography. The size of the individual components in the devices is constantly decreasing, and the number of layers in the devices is increasing. As a result, the density of components and the aspect ratios of depressions (e.g., the ratio of the depth to the size of the opening) are increasing. The size of workpieces is also increasing to provide more real estate for forming more dies (i.e., chips) on a single workpiece. Many fabricators, for example, are transitioning from 200 mm to 300 mm workpieces, and even larger workpieces will likely be used in the future. Thin film deposition techniques accordingly strive to produce highly uniform conformal layers that cover the sidewalls, bottoms, and corners in deep depressions that have very small openings.

One widely used thin film deposition technique is Chemical Vapor Deposition (CVD). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a thin solid film at the workpiece surface. The most common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials that are already formed on the workpiece. Implanted or doped materials, for example, can migrate in the silicon substrate at higher temperatures. On the other hand, if more reactive precursors are used so that the workpiece temperature can be lower, then reactions may occur prematurely in the gas phase before reaching the substrate. This is not desirable because the film quality and uniformity may suffer, and also because it limits the types of precursors that can be used.

One conventional system to prevent premature reactions injects the precursors into the reaction chamber through separate ports. For example, each port of a shower head can be coupled to a dedicated gas line for a single gas. Systems that present the precursors through dedicated ports proximate to the surface of the workpiece, however, may not sufficiently mix the precursors. Accordingly, the precursors may not react properly to form a thin solid film at the workpiece surface. Furthermore, conventional systems also have a jetting effect that produces a higher deposition rate directly below the ports. Thus, conventional CVD systems may not be appropriate for many thin film applications.

Figure 1A:
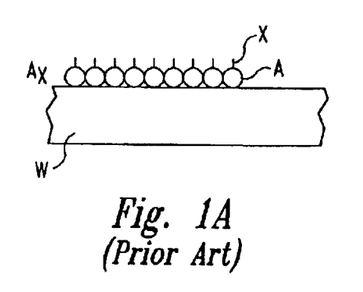
FIGS. 1A and 1B are schematic cross-sectional views of stages in ALD processing in accordance with the prior art.
Figure 1B:
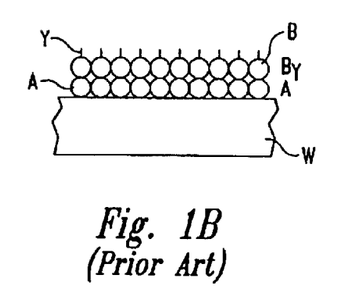

Atomic Layer Deposition (ALD) is another thin film deposition technique. FIGS. 1A and 1B schematically illustrate the basic operation of ALD processes. Referring to FIG. 1A, a layer of gas molecules $A_x$ coats the surface of a workpiece W. The layer of $A_x$ molecules is formed by exposing the workpiece W to a precursor gas containing $A_x$ molecules, and then purging the chamber with a purge gas to remove excess $A_x$ molecules. This process can form a monolayer of $A_x$ molecules on the surface of the workpiece W because the $A_x$ molecules at the surface are held in place during the purge cycle by physical adsorption forces at moderate temperatures or chemisorption forces at higher temperatures. The layer of $A_x$ molecules is then exposed to another precursor gas containing $B_y$ molecules. The $A_x$ molecules react with the $B_y$ molecules to form an extremely thin layer of solid material on the workpiece W. The chamber is then purged again with a purge gas to remove excess $B_y$ molecules.

Figure 2:
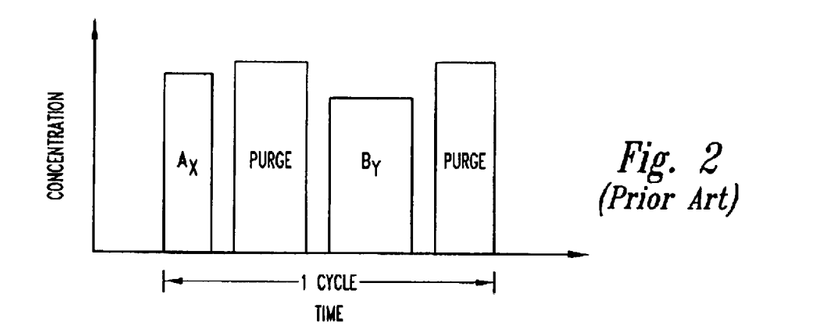
FIG. 2 is a graph illustrating a cycle for forming a layer using ALD in accordance with the prior art.

FIG. 2 illustrates the stages of one cycle for forming a thin solid layer using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. In actual processing several cycles are repeated to build a thin film on a workpiece having the desired thickness. For example, each cycle may form a layer having a thickness of approximately 0.5–1.0 Å, and thus it takes approximately 60–120 cycles to form a solid layer having a thickness of approximately 60 Å.

Figure 3:
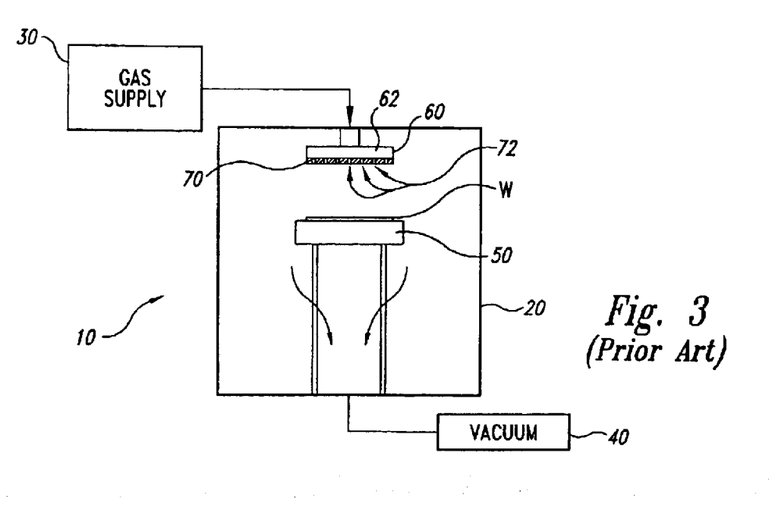
FIG. 3 is a schematic representation of a system including a reactor for depositing a material onto a microelectronic workpiece in accordance with the prior art.

FIG. 3 schematically illustrates an ALD reactor 10 having a chamber 20 coupled to a gas supply 30 and a vacuum 40. The reactor 10 also includes a heater 50 that supports the workpiece W and a gas dispenser 60 in the chamber 20. The gas dispenser 60 includes a plenum 62 operatively coupled to the gas supply 30 and a distributor plate 70 having a plurality of holes 72. In operation, the heater 50 heats the workpiece W to a desired temperature, and the gas supply 30 selectively injects the first precursor $A_x$, the purge gas, and the second precursor $B_y$ as shown above in FIG. 2. The vacuum 40 maintains a negative pressure in the chamber to draw the gases from the gas dispenser 60 across the workpiece W and then through an outlet of the chamber 20.

One drawback of ALD processing is that it has a relatively low throughput compared to CVD techniques. For example, ALD processing typically takes several seconds to perform each $A_x$-purge-$B_y$-purge cycle. This results in a total process time of several minutes to form a single thin layer of only 60–100 Å. In contrast to ALD processing, CVD techniques require much less time to form similar layers. The low throughput of existing ALD techniques limits the utility of the technology in its current state because ALD may be a bottleneck in the overall manufacturing process. Thus, it would be useful to increase the throughput of ALD techniques so that they can be used in a wider range of applications. Another drawback of ALD processing is that it is difficult to control the uniformity of the deposited films because the holes 72 in the distributor plate 70 also cause a jetting affect that results in a higher deposition rate in-line with the holes 72. Therefore, a need exists in semiconductor fabrication to increase the deposition uniformity in both CVD and ALD processes.

SUMMARY

The present invention is directed toward reactors having gas distributors for depositing materials onto micro-device workpieces, systems that include such reactors, and methods for depositing materials onto micro-device workpieces. In one embodiment, a reactor for depositing material onto a micro-device workpiece includes a reaction chamber and a gas distributor in the reaction chamber. The gas distributor includes a first gas conduit having a first injector and a second gas conduit having a second injector. In one aspect of this embodiment, the first injector projects a first gas flow along a first vector and the second injector projects a second gas flow along a second vector that intersects the first vector in a mixing zone. In another aspect of this embodiment, the gas distributor can also include a mixing recess that defines the mixing zone. The mixing recess can have a variety of configurations, such as a conical, cubical, cylindrical, frusto-conical, pyramidical or other configurations. The first injector can project the first gas flow into the mixing recess along the first vector, and the second injector can project the second gas flow into the mixing recess along the second vector. In a further aspect of this embodiment, the first and second injectors are positioned within the mixing recess. The mixing zone can be positioned partially within the mixing recess.

In another embodiment, a reactor for depositing material onto a micro-device workpiece includes a reaction chamber, a workpiece support in the reaction chamber, and a gas distributor with a mixing recess in the reaction chamber. The mixing recess is exposed to the workpiece support. The gas distributor includes a first gas conduit having a first injector and a second gas conduit having a second injector. The first injector projects a first gas flow into the mixing recess along a first vector and the second injector projects a second gas flow into the mixing recess along a second vector.

These reactors can be used to perform several methods for depositing materials onto micro-device workpieces. In one embodiment, a method includes flowing the first gas through the first injector of the gas distributor along a first vector, and flowing the second gas through the second injector of the gas distributor along a second vector. The second vector intersects the first vector in the mixing zone over the micro-device workpiece. In another embodiment, a method includes flowing the first gas through the first injector of the gas distributor into the mixing recess, and flowing the second gas through the second injector of the gas distributor into the mixing recess over the micro-device workpiece. In a further embodiment, a method includes dispensing a first pulse of the first gas from a first outlet into a recess in the gas distributor, and dispensing a second pulse of the second gas from a second outlet into the recess in the gas distributor after terminating the first pulse of the first gas.

DETAILED DESCRIPTION

The following disclosure describes several embodiments of reactors having gas distributors for depositing material onto micro-device workpieces, systems including such reactors, and methods for depositing materials onto micro-device workpieces. Many specific details of the invention are described below with reference to depositing materials onto micro-device workpieces. The term "micro-device workpiece" is used throughout to include substrates upon which and/or in which microelectronic devices, micromechanical devices, data storage elements, read/write components, and other features are fabricated. For example, micro-device workpieces can be semiconductor wafers, such as silicon or gallium arsenide wafers, glass substrates, insulative substrates, and many other types of materials. The term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 4–9 and the following text to provide a thorough understanding of particular embodiments of the invention. A person skilled in the art will understand, however, that the invention may have additional embodiments, or that the invention may be practiced without several of the details of the embodiments shown in FIGS. 4–9.

A. Deposition Systems

Figure 4:
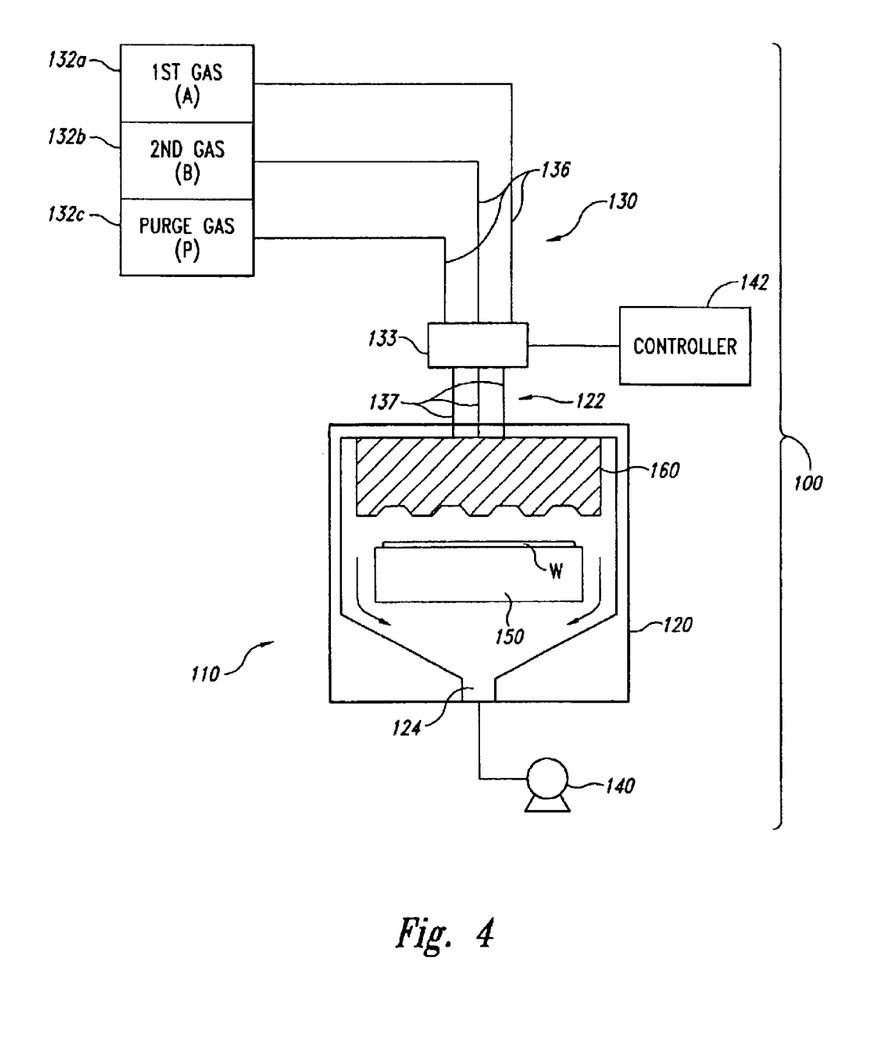
FIG. 4 is a schematic representation of a system having a reactor for depositing material onto a micro-device workpiece in accordance with one embodiment of the invention.

FIG. 4 is a schematic representation of a system 100 for depositing material onto a micro-device workpiece in accordance with one embodiment of the invention. In this embodiment, the system 100 includes a reactor 110 having a reaction chamber 120 coupled to a gas supply 130 and a vacuum 140. For example, the reaction chamber 120 can have an inlet 122 coupled to the gas supply 130 and an outlet 124 coupled to the vacuum 140.

The gas supply 130 includes a plurality of gas sources 132 (identified individually as 132a–c), a valve assembly 133 having a plurality of valves, and a plurality of gas lines 136 and 137. The gas sources 132 can include a first gas source 132a for providing a first precursor A, a second gas source 132b for providing a second precursor B, and a third gas source 132c for providing a purge gas P. The first and second precursors A and B are the gas or vapor phase constituents that react to form the thin, solid layer on the workpiece W. The purge gas P can be a suitable type of gas that is compatible with the reaction chamber 120 and the workpiece W. The gas supply 130 can include more gas sources 132 for applications that require additional precursors or purge gases in other embodiments. The valve assembly 133 is operated by a controller 142 that generates signals for pulsing the individual gases through the reaction chamber 120.

The reactor 110 in the embodiment illustrated in FIG. 4 also includes a workpiece support 150 and a gas distributor 160, such as a shower head, in the reaction chamber 120. The workpiece support 150 is typically heated to bring the workpiece W to a desired temperature for catalyzing the reaction between the first precursor A and the second precursor B at the surface of the workpiece W. The workpiece support 150 is a plate with a heating element in one embodiment of the reaction chamber 120. The workpiece support 150, however, may not be heated in other applications.

B. Gas Distributors

Figure 5:
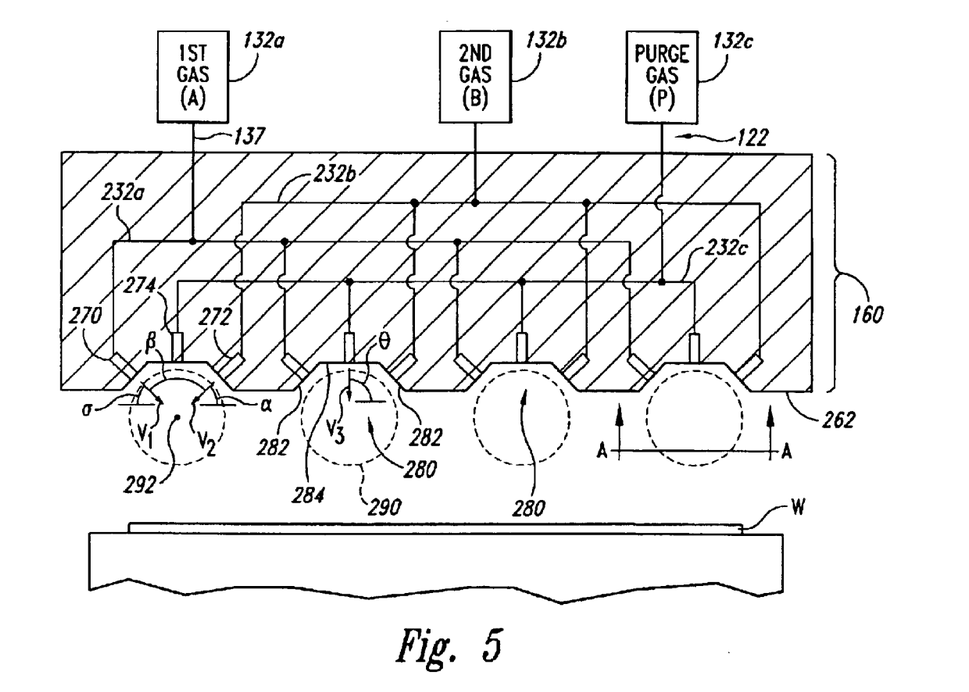
FIG. 5 is a schematic representation of the gas distributor shown in FIG. 4 having a plurality of mixing recesses.

FIG. 5 is a schematic representation of the gas distributor 160 shown in FIG. 4 having a plurality of mixing recesses 280. In this embodiment, the gas distributor 160 has a first surface 262 with mixing recesses 280 that provide zones in which gas flows can mix before flowing to the workpiece W. In CVD applications, the precursors A and B can mix in the recesses 280 before flowing to the workpiece W. In ALD applications, precursor A can mix in the recesses 280 during a pulse and then precursor B can mix in the recesses 280 during a subsequent pulse after alternating purge gas P pulses. The mixing recesses 280 can be spaced uniformly throughout the first surface 262 to provide constant volumes over the entire workpiece W. In this embodiment, the mixing recesses 280 have a generally frusto-conical shape with a first wall 282 defining the side of the conical section and a second wall 284 defining the bottom of the mixing recess 280. In other embodiments explained below, the mixing recesses 280 can have other shapes, such as those described below with reference to FIGS. 7A–7D; in additional embodiments explained below, the gas distributor 160 may not have mixing recesses 280, such as the embodiment described below with reference to FIG. 9.

In the embodiment illustrated in FIG. 5, the gas distributor 160 includes a plurality of first injectors 270 positioned in the first wall 282, a plurality of second injectors 272 positioned in the first wall 282 at different locations, and a plurality of third injectors 274 positioned in the second wall 284. The injectors 270, 272, and 274 are oriented to project gas flows into the mixing recesses 280. The first injectors 270 are coupled to the first gas source 132a by a first gas conduit 232a. The first gas conduit 232a receives the first precursor A from the gas line 137 at the inlet 122 and distributes the first precursor A throughout the gas distributor 160 to the first injectors 270. Similarly, the second injectors 272 are coupled to the second gas source 132b by a second gas conduit 232b, and the third injectors 274 are coupled to the third gas source 132c by a third gas conduit 232c.

Each of the first injectors 270 is oriented to project a first gas flow into the mixing recesses 280 along a first vector $V_1$ at an angle σ with respect to the workpiece W. Each of the second injectors 272 is oriented to project a second gas flow into the mixing recesses 280 along a second vector $V_2$ at an angle α with respect to the workpiece W. The second vector $V_2$ forms an angle β with respect to the first vector $V_1$. In the illustrated embodiment, the second vector $V_2$ is transverse (i.e., non-parallel) to the first vector $V_1$. In other embodiments, such as the embodiment described below with reference to FIG. 7A, the second vector $V_2$ can be generally parallel to the first vector $V_1$. The first vector $V_1$ intersects the second vector $V_2$ at an intersection point 292 in a mixing zone 290 located proximate to the workpiece W. Each of the third injectors 274 is oriented to project a third gas flow into the mixing recesses 280 along a third vector $V_3$ at an angle θ with respect to the workpiece W.

Figure 6:
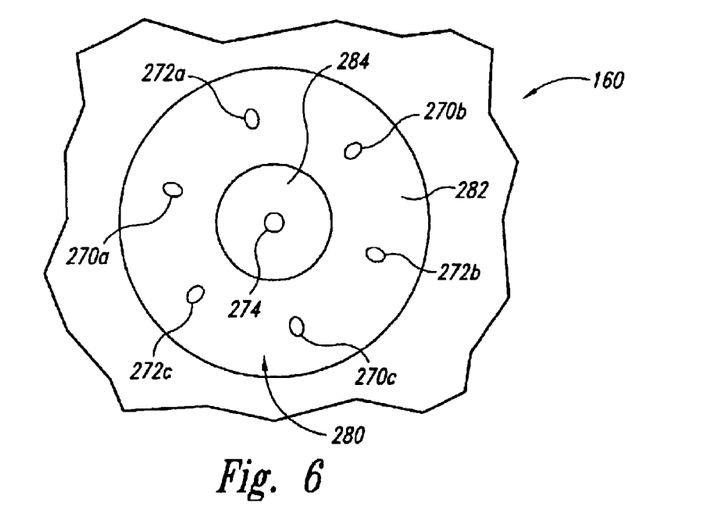
FIG. 6 is a bottom view of one mixing recess taken substantially along the line A—A of FIG. 5.

FIG. 6 is a bottom view of one mixing recess 280 of the gas distributor 160 taken substantially along the line A—A of FIG. 5. In the illustrated embodiment, the mixing recess 280 includes a plurality of first injectors 270 (identified individually as 270a–c) and a plurality of second injectors 272 (identified individually as 272a–c) in the first wall 282 positioned annularly around the third injector 274. In other embodiments, the first injectors 270, the second injectors 272, and/or the third injector 274 can be arranged in different patterns or configurations. For example, the mixing recess 280 can have only one first injector 270, one second injector 272, and one third injector 274, or the mixing recess can have a plurality of third injectors 274 located in the first wall 282 interspersed between the first injectors 270 and the second injectors 272. In further embodiments, some of the first injectors 270 and/or second injectors 272 can be positioned in the second wall 284.

C. Methods for Depositing Material on Micro-Device Workpieces

Referring to FIG. 5, in one aspect of the embodiment, the gas distributor 160 can be used in CVD processing. For example, the first injectors 270 can project the first precursor A along the first vector $V_1$ into the mixing zones 290, and the second injectors 272 can simultaneously project the second precursor B along the second vector $V_2$ into the mixing zones 290. Accordingly, the first and second precursors A and B mix together in the mixing zones 290. The orientation of the first and second injectors 270 and 272 (and accordingly the first and second vectors $V_1$ and $V_2$) facilitates the mixing of the first and second precursors A and B by flowing the gases into each other. Consequently, a mixture of the first and second precursors A and B is presented to the workpiece W.

In a further aspect of this embodiment, the gas distributor 160 can be used in both continuous flow and pulsed CVD applications. In a pulsed CVD application, a pulse of both the first precursor A and the second precursor B can be dispensed substantially simultaneously. After a pulse of the first and second precursors A and B, the third injector 274 can dispense a pulse of purge gas P along the third vector $V_3$ into the mixing recesses 280 to purge excess molecules of the first and second precursors A and B. After purging, the process can be repeated with pulses of the first and second precursors A and B. In another pulsed CVD application, the purge gas P flows continuously and pulses of the first and second precursors are injected into the continuous flow of the purge gas. The purge gas P, for example, can flow continuously along the third vector $V_3$.

In another aspect of this embodiment, the gas distributor 160 can be used in ALD processing. For example, the first injectors 270 can project the first precursor A containing molecules $A_x$ into the mixing recesses 280. In the illustrative embodiment, the orientation of the first injectors 270 in the mixing recesses 280 causes the first precursor molecules $A_x$ to mix sufficiently to form a uniform layer across the surface of the workpiece W. Next, the third injector 274 can project the purge gas P to purge excess first precursor molecules $A_x$ from the mixing recesses 280. This process can form a monolayer of $A_x$ molecules on the surface of the workpiece W because the $A_x$ molecules at the surface are held in place during the purge cycle by physical adsorption forces at moderate temperatures or chemisorption forces at higher temperatures. The second injectors 272 can then project the second precursor B containing $B_y$ molecules into the mixing recesses 280. The $B_y$ molecules also mix and form a uniform layer across the surface of the workpiece W. The $A_x$ molecules react with the $B_y$ molecules to form an extremely thin solid layer of material on the workpiece W. The mixing recesses 280 are then purged again and the process is repeated.

In a further aspect of this embodiment, the first and second injectors 270 and 272 can sequentially project the first and second precursors A and B to induce a vortex within the mixing recesses 280 in order to further increase the mixing. For example, referring to FIG. 6, the first injector 270*a* may dispense a first pulse of gas, followed by pulses from the first injector 270*b* and then the first injector 270*c*. In another aspect of this embodiment, the first injector 270*a* and the second injector 272*a* can dispense pulses of gas simultaneously, after which the first and second injectors 270*b* and 272*b* can dispense pulses simultaneously, and then the first and second injectors 270*c* and 272*c* can dispense pulses simultaneously. Accordingly, the first and second injectors 270 and 272 can sequentially project the first and second precursors A and B to increase mixing within the mixing recesses 280.

One advantage of this embodiment with respect to the CVD process is that by using dedicated injectors 270, 272 and 274 and gas conduits 232 for each gas, the precursors A and B are kept separate, and accordingly, do not react prematurely. Furthermore, because the precursors A and B do not react prematurely, precursors that are highly reactive can be used, avoiding the need to heat the workpiece W to detrimentally high temperatures. Another advantage of this embodiment with respect to the ALD and CVD processes is that the enhanced mixing of the gases reduces the jetting effect and creates a uniform deposition across the surface of the workpiece W. A further advantage of this embodiment is that the position of the purge gas injectors 274 at the base of the mixing recesses 280 prevents the other gases from being trapped in the mixing recesses 280. Another advantage of this embodiment is that the flow to each mixing recess can be independently controlled to compensate for nonuniformities on the workpiece W. For example, if the surface at the center of the workpiece W is too thick, the flow of gases from the injectors over the center of the workpiece W can be reduced. Still another advantage is that the chemical composition of the deposited film can be controlled precisely because the mixing at the outlets provides more precise reactions at the workpiece surface.

D. Other Gas Distributors

FIGS. 7A–7D are schematic representations of portions of gas distributors having mixing recesses and injectors in accordance with additional embodiments of the invention. Each figure illustrates a different mixing recess and a particular arrangement of injectors; however, each arrangement of injectors can be used in conjunction with any of the mixing recesses. For example, the injector arrangements with only first and second injectors, such as those disclosed with reference to FIGS. 7C and 7D, can be used with any of the mixing recesses.

Figure 7A:
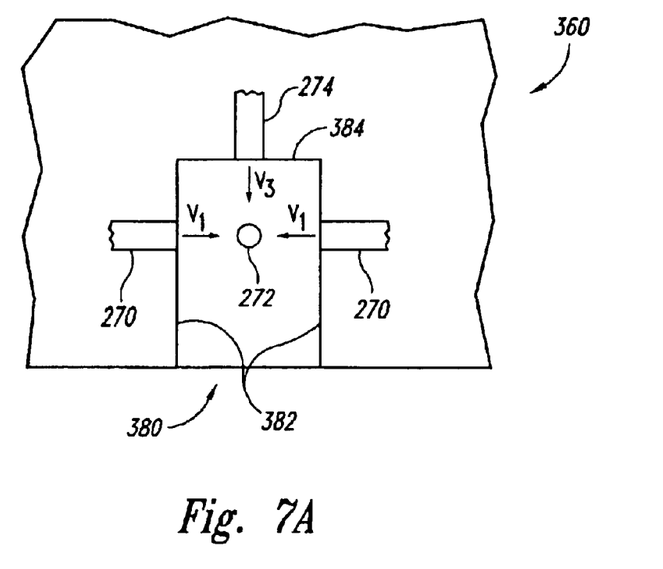
FIGS. 7A–7D are schematic representations of portions of gas distributors having mixing recesses in accordance with additional embodiments of the invention.

FIG. 7A illustrates a gas distributor 360 having a mixing recess 380 in accordance with another embodiment of the invention. The mixing recess 380 has a generally cylindrical shape with a first wall 382 defining the side of the cylinder and a second wall 384 defining the bottom of the mixing recess 380. In another embodiment, the mixing recess 380 could have a different shape, such as a rectangular shape with the first wall 382 being one of the four rectangular sidewalls. In the illustrated embodiment, the gas distributor 360 also includes two first injectors 270 positioned in the first wall 382 at diametrically opposed locations, two second injectors 272 (only one shown) positioned in the first wall 382 offset from the first injector 270 by 90°, and the third injector 274 positioned in the second wall 384. The first injectors 270 project the first gas flow into the mixing recess 380 along first vectors $V_1$ generally parallel to the workpiece W (not shown), and the second injectors 272 project the second gas flow into the mixing recess 380 along second vectors $V_2$ generally parallel to the workpiece W and normal to the first vectors $V_1$. The third injector 274 is oriented to project the third gas flow along the third vector $V_3$ into the mixing recess 380 in a direction generally normal to the workpiece W.

Figure 7B:
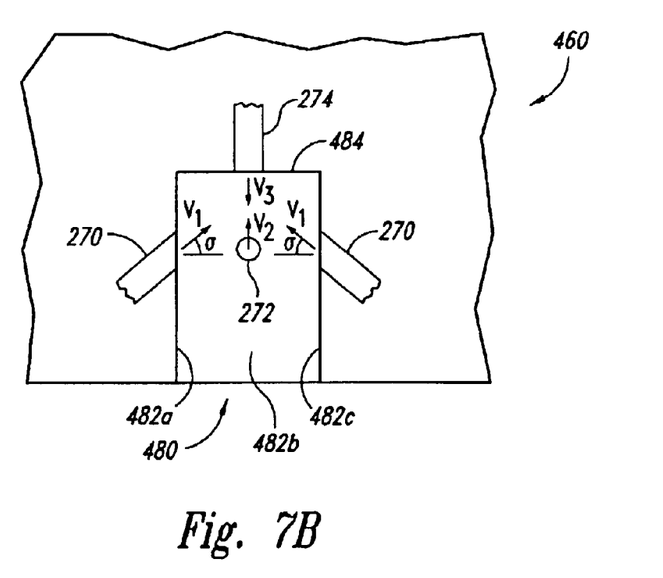

FIG. 7B is a schematic representation of a portion of a gas distributor 460 having a mixing recess 480 in accordance with another embodiment of the invention. The mixing recess 480 has a generally cubical shape with first walls 482*a*, 482*b*, and 482*c* defining three sides of the cube and a second wall 484 defining the bottom of the mixing recess 480. In another embodiment, the mixing recess 480 can have a different shape, such as a pyramidical shape with the first walls 482 being three sidewalls of the pyramid. In the illustrated embodiment, the gas distributor 460 includes first injectors 270 positioned in the first walls 482*a* and 482*c*, second injectors 272 positioned in the first wall 482*b* and a first wall (not shown) opposite the wall 482*b*. The gas distributor 460 also includes a third injector 274 positioned in the second wall 484. The first injectors 270 project the first gas flow along first vectors $V_1$ into the mixing recess 480 at the angle σ with respect to the workpiece W (not shown). The second injectors 272 project the second gas flow along second vectors $V_2$ into the mixing recess 480 at an angle with respect to the workpiece W. The third injector 274 is oriented to project the third gas flow along the third vector $V_3$ into the mixing recess 480 in a direction generally normal to the workpiece W.

Figure 7C:
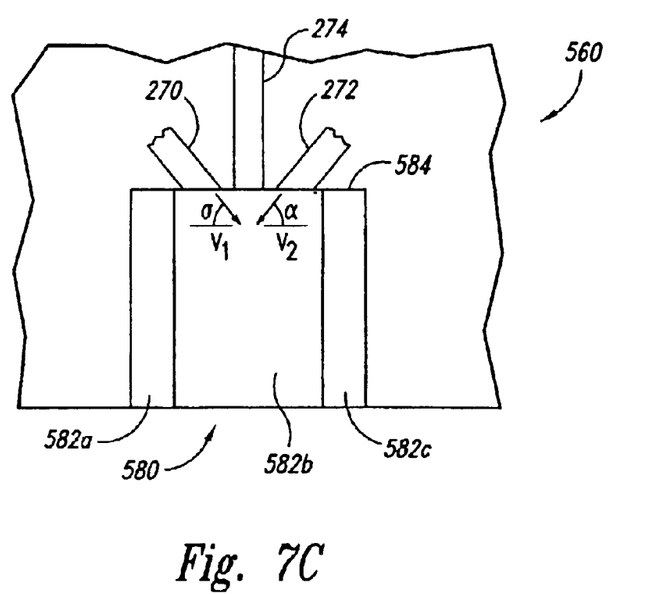

FIG. 7C is a schematic representation of a portion of a gas distributor 560 having a mixing recess 580 in accordance with another embodiment of the invention. The mixing recess 580 has a generally hexagonal shape with first walls 582*a*, 582*b*, and 582*c* defining sides of the hexagon and a second wall 584 defining the bottom of the mixing recess 580. The gas distributor 560 includes the first injector 270 positioned in the second wall 584 and the second injector 272 positioned in the second wall 584. The first injector is oriented to project the first gas flow along the vector $V_1$ into the mixing recess 580 at the angle σ with respect to the workpiece W (not shown). The second injector 272 is oriented to project the second gas flow along the second vector $V_2$ into the mixing recess 580 at the angle α with respect to the workpiece W.

Figure 7D:
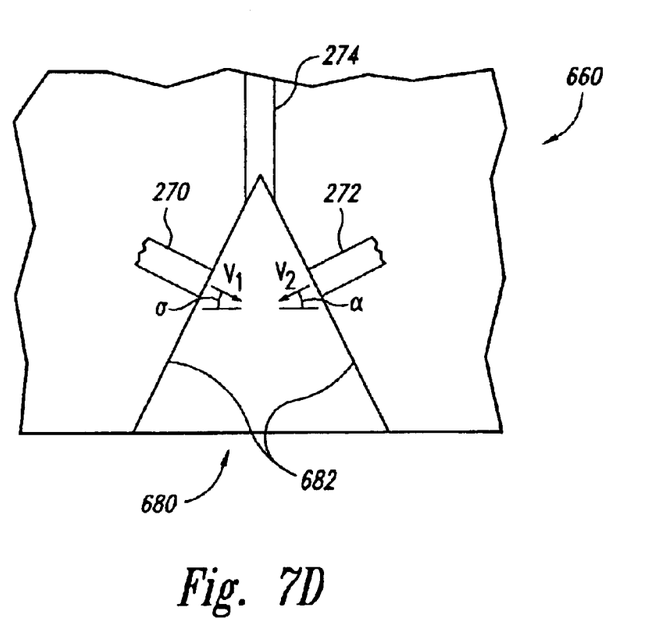

FIG. 7D is a schematic representation of a portion of a gas distributor 660 having a mixing recess 680 in accordance with another embodiment of the invention. The mixing recess 680 has a generally conical shape with a first wall 682 defining the side of the cone. In another embodiment, the mixing recess 680 could have a different shape, such as a pyramidical shape, with the first wall 682 being one of the sidewalls. In the illustrated embodiment, the gas distributor 660 includes the first injector 270 positioned in the first wall 682 and the second injector 272 positioned in the first wall 682 opposite the first injector 270. The first injector 270 is oriented to project the first gas flow along the first vector $V_1$ into the mixing recess 680 at the angle σ with respect to the workpiece W (not shown). The second injector 272 is oriented to project the second gas flow along the second vector $V_2$ into the mixing recess 680 at the angle α with respect to the workpiece W. In other embodiments, the first and second injectors 270 and 272 can be offset individually or in pairs as explained above with reference to FIG. 7A.

Figure 8:
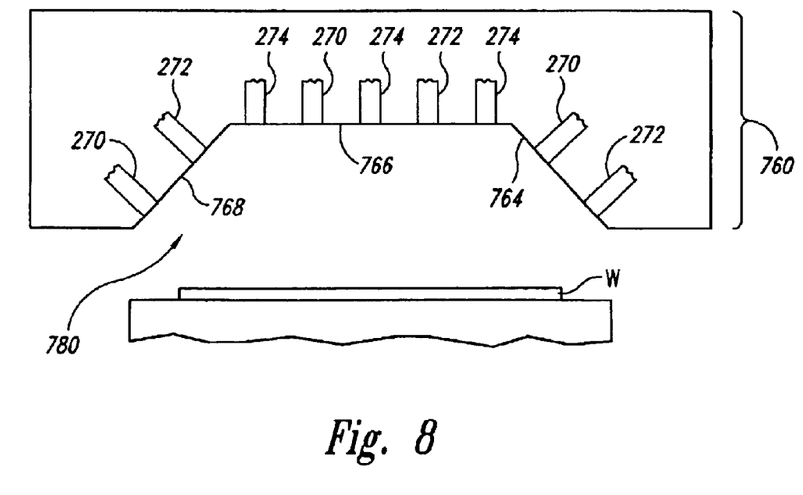
FIG. 8 is a schematic representation of a gas distributor in accordance with another embodiment of the invention.

FIG. 8 is a schematic representation of a gas distributor 760 in accordance with another embodiment of the invention. The gas distributor 760 has a first wall 764, a second wall 766, and a third wall 768 that at least partially define a mixing recess 780. The mixing recess 780 is positioned over the workpiece W. The gas distributor 760 includes the first injectors 270, the second injectors 272, and the third injectors 274. The first injectors 270 and the second injectors 272 are interspersed along the walls 764, 766, and 768 and are positioned to project gases into the mixing recess 780. In the illustrated embodiment, many of the injectors 270, 272, and 274 can be oriented at different angles with respect to the workpiece W to facilitate mixing of the gases before deposition onto the workpiece W. In other embodiments, the injectors 270, 272, and 274 can be arranged differently, such as at different angles or positions in the walls 764, 766, and 768. In other embodiments, the gas distributor 760 can have different shapes or configurations, such as those illustrated in FIGS. 5–7D.

Figure 9:
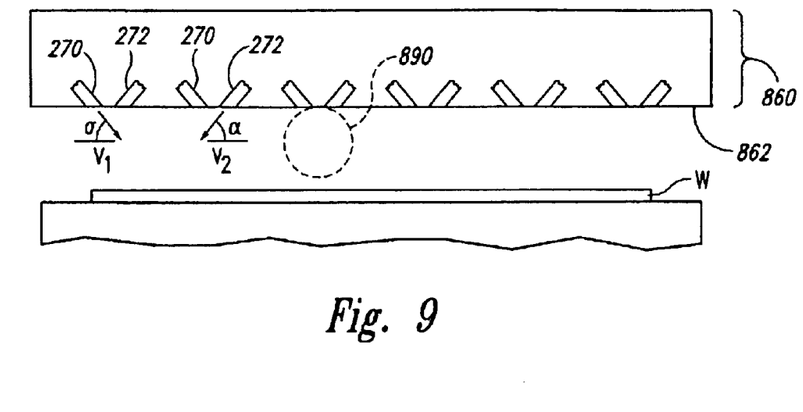
FIG. 9 is a schematic representation of a gas distributor in accordance with another embodiment of the invention.

FIG. 9 is a schematic representation of a gas distributor 860 in accordance with another embodiment of the invention. The gas distributor 860 has a first surface 862 from which the first injectors 270 and the second injectors 272 project the individual gas flows. The injectors 270 and 272 can be arranged in pairs (including one first injector 270 and one second injector 272) across the first surface 862 of the gas distributor 860. Each first injector 270 projects the first gas along the first vector $V_1$ at the angle σ with respect to the workpiece W. Similarly, each second projector 272 projects the second gas along the second vector $V_2$ at the angle α with respect to the workpiece W. The first and second gases mix in a mixing zone 890 above the workpiece W. In other embodiments, pairs of first injectors 270 can inject a single gas flow along the first and second vectors $V_1$ and $V_2$, and pairs of second injectors 272 can inject another individual gas flow along the first and second vectors $V_1$ and $V_2$ in a different mixing zone.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A reactor for depositing material onto a micro-device workpiece, comprising:
    a reaction chamber; and
    a gas distributor in the reaction chamber, the gas distributor comprising a shower head, a first gas conduit having a first injector, a second gas conduit having a second injector, and a third gas conduit having a third injector, wherein the first injector projects a first gas flow along a first vector, the second injector projects a second gas flow along a second vector that intersects the first vector in a mixing zone, and the third injector projects a third gas flow into the mixing zone, and wherein a surface of the shower head at least partially defines the mixing zone.

2. The reactor of claim 1 wherein the first vector is transverse relative to the second vector.

3. The reactor of claim 1 wherein the first vector is generally parallel to the second vector.

4. The reactor of claim 1 wherein the gas distributor further comprises a mixing recess, and wherein the mixing zone is positioned at least partially within the mixing recess.

5. The reactor of claim 1 wherein the first gas conduit has a plurality of first injectors and the second gas conduit has a plurality of second injectors.

6. The reactor of claim 1 wherein the first gas conduit has a plurality of first injectors and the second gas conduit has a plurality of second injectors, and wherein the plurality of first and second injectors are arranged in a generally annular configuration.

7. The reactor of claim 1 wherein the gas distributor has further comprises a plurality of recesses facing the workpiece, and wherein the individual recesses define mixing zones.

8. The reactor of claim 1, further comprising a workpiece support in the reaction chamber.

9. A reactor for depositing material onto a micro-device workpiece, comprising:
    a reaction chamber; and
    a gas distributor in the reaction chamber, the gas distributor comprising a first gas conduit having a plurality of first injectors, a second gas conduit having a plurality of second injectors and a first surface having a plurality of mixing recesses, wherein the first injectors projects a first gas flow into the mixing recesses and the second injectors projects a second gas flow into the mixing recesses.

10. The reactor of claim 9 wherein at least one of the first injectors projects the first gas flow along a first vector and at least one of the second injectors projects the second gas flow along a second vector, and wherein the first vector is transverse relative to the second vector.

11. The reactor of claim 9 wherein at least one of the first injectors projects the first gas flow along a first vector and at least one of the second injectors projects the second gas flow along a second vector, and wherein the first vector is generally parallel to the second vector.

12. The reactor of claim 9 wherein at least one of the first injectors projects the first gas flow along a first vector and at least one of the second injectors projects the second gas flow along a second vector, and wherein at least one of the first and second vectors is oriented nonperpendicularly relative to the micro-device workpiece.

13. The reactor of claim 9 wherein the first and second injectors are configured to induce a vortex in the individual mixing recesses.

14. The reactor of claim 9 wherein the first and second injectors are arranged in a generally annular configuration.

15. The reactor of claim 9 wherein the gas distributor further comprises a third gas conduit having a plurality of third injectors.

16. The reactor of claim 9 wherein at least one mixing recess has a conical configuration.

17. The reactor of claim 9 wherein at least one mixing recess has a cubical configuration.

18. The reactor of claim 9 wherein at least one mixing recess has a cylindrical configuration.

19. The reactor of claim 9 wherein at least one mixing recess has a frusto-conical configuration.

20. The reactor of claim 9 wherein at least one mixing recess has a pyramidical configuration.

21. The reactor of claim 9 wherein the gas distributor comprises a shower head.

22. A reactor for depositing material onto a micro-device workpiece, comprising:
    a reaction chamber; and
    a gas distributor in the reaction chamber, the gas distributor comprising a first gas conduit having a plurality of first injectors, a second gas conduit having a plurality of second injectors, and a plurality of mixing recesses, wherein the first and second injectors are positioned within the mixing recesses, wherein the first injectors project a first gas flow into a plurality of mixing zones and the second injectors project a second gas flow into the mixing zones and wherein the individual mixing zones are positioned at least partially within corresponding mixing recesses.

23. The reactor of claim 22 wherein at least one of the first injectors projects the first gas flow along a first vector and at least one of the second injectors projects the second gas flow along a second vector, and wherein the first vector is transverse relative to the second vector.

24. The reactor of claim 22 wherein the first and second injectors are arranged in a generally annular configuration.

25. The reactor of claim 22 wherein the gas distributor further comprises a third gas conduit having a plurality of third injectors.

26. The reactor of claim 22 wherein at least one mixing recess has a conical configuration.

27. The reactor of claim 22 wherein at least one mixing recess has a cubical configuration.

28. The reactor of claim 22 wherein at least one mixing recess has a cylindrical configuration.

29. The reactor of claim 22 wherein at least one mixing recess has a frusto-conical configuration.

30. The reactor of claim 22 wherein at least one mixing recess has a pyramidical configuration.

31. The reactor of claim 22 wherein the gas distributor comprises a shower head.

32. A reactor for depositing material onto a micro-device workpiece, comprising:
   a reaction chamber; and
   a gas distributor in the reaction chamber, the gas distributor comprising a plurality of first outlets coupled to a first gas conduit, a plurality of second outlets coupled to a second gas conduit, and a plurality of mixing recesses, wherein the individual mixing recesses have at least one first outlet and at least one second outlet to flow gases from the first and second gas conduits into mixing recess.

33. The reactor of claim 32 wherein the gas distributor comprises a plurality of third outlets coupled to a third gas conduit, and wherein the individual mixing recesses have at least one third outlet.

34. The reactor of claim 32 wherein the gas distributor comprises a shower head.

35. A reactor for depositing material onto a micro-device workpiece, comprising:
   a reaction chamber; and
   a gas distributor in the reaction chamber, the gas distributor comprising a bottom plate facing the workpiece, a first inlet configured for attachment to a first gas source, a second inlet configured for attachment to a second gas source, a plurality of first outlets in fluid communication with the first inlet, a plurality of second outlets in fluid communication with the second inlet, and a means for mixing a first flow from the first outlets and a second flow from the second outlets in a cross-flow within a mixing zones below a portion of the bottom plate.

36. The reactor of claim 35 wherein the gas distributor further comprises a third inlet configured for attachment to a third gas source, and a plurality of third outlets in fluid communication with the third inlet.

37. The reactor of claim 35 wherein the means for mixing comprises a plurality of mixing recesses in a lower surface of the bottom plate.

38. A reactor for depositing material onto a micro-device workpiece, comprising:
   a reaction chamber;
   a workpiece support in the reaction chamber; and
   a gas distributor in the reaction chamber, the gas distributor comprising a plurality of external mixing recesses exposed to and generally facing the workpiece support, a first gas conduit having a plurality of first injectors at mixing recesses, and a second gas conduit having a plurality of second injectors at mixing recesses, wherein the first injectors projects a first gas flow into mixing recesses and the second injectors project a second gas flow into mixing recesses.

39. The reactor of claim 38 wherein the first injectors project the first gas flow alone first vectors and the second injectors project the second gas flow along second vectors, wherein the first vectors intersects corresponding second vectors in mixing zones and wherein mixing zones are positioned at least partially in corresponding mixing recesses.

40. The reactor of claim 38 wherein mixing recesses are defined by a bottom panel of the gas distributor.

41. A system for depositing material onto a surface of a micro-device workpiece, comprising:
   a gas supply assembly having a first gas source, a second gas source, and a third gas source;
   a reaction chamber coupled to the gas supply assembly;
   a workpiece support in the reaction chamber; and
   a gas distributor in the reaction chamber, the gas distributor comprising a shower head, a first gas conduit coupled to the first gas source, a second gas conduit coupled to the second gas source, a third gas conduit coupled to the third gas source, a plurality of first injectors coupled to the first gas conduit, a plurality of second injectors coupled to the second gas conduit, and a plurality of third injectors coupled to the third gas conduit, wherein the first injectors project a first gas flow along first vectors that intersect in a mixing zone along an external surface of the gas distributor generally facing the workpiece support, and wherein the second injectors project a second gas flow along second vectors that intersect in mixing zone.

42. The system of claim 41 wherein the gas distributor further comprises a mixing recess, and wherein mixing zone is positioned at least partially in mixing recess.

43. A system for depositing material onto a surface of a micro-device workpiece, comprising:
   a gas supply assembly having a first gas source and a second gas source;
   a reaction chamber coupled to the gas supply assembly;
   a workpiece support in the reaction chamber: and
   a gas distributor in the reaction chamber, the gas distributor comprising a first gas conduit coupled to the first gas source, a second gas conduit coupled to the second gas source, and a first surface having an external mixing recess, wherein the first gas conduit has a first injector that projects a first gas flow into mixing recess and the second gas conduit has a second injector that projects the second gas flow into the mixing recess, and wherein the first and second injectors are positioned to induce a vortex in mixing recess.

44. The system of claim 43 wherein the first injector projects the first gas flow along a first vector and the second injector projects the second gas flow along a second vector, and wherein the first vector is transverse relative to the second vector.

45. A system for depositing material onto a surface of a micro-device workpiece, comprising:
    a gas supply assembly having a first gas source and a second gas source;
    a reaction chamber coupled to the gas supply assembly;
    a workpiece support in the reaction chamber; and
    a gas distributor in the reaction chamber, the gas distributor comprising a first gas conduit coupled to the first gas source, a second gas conduit coupled to the second gas source, and plurality of external mixing recesses, the first gas conduit having a plurality of first injectors positioned within mixing recesses, the second conduit having a plurality of second injectors positioned within mixing recesses, wherein the first injectors project a first gas flow into mixing zones and the second injectors project a second gas flow into mixing zones, and wherein mixing zones are positioned at least partially within corresponding mixing recesses.

46. The system of claim 45 wherein the at least one mixing recess has a frusto-conical configuration.

47. The system of claim 45 wherein the first injectors project the first gas flow along first vectors and the second injectors project the second gas flow along a second vectors, and wherein the first vectors are transverse relative to corresponding second vectors.

48. A system for depositing material onto a surface of a micro-device workpiece, comprising:
    a gas supply assembly having a first gas source and a second gas source;
    a reaction chamber coupled to the gas supply assembly;
    a workpiece support in the reaction chamber; and
    a gas distributor in the reaction chamber, the gas distributor comprising a first gas conduit coupled to the first gas source, a second gas conduit coupled to the second gas source, and a plurality of external mixing recesses facing the workpiece support, wherein the first gas conduit has a plurality of first outlets and the second gas conduit has a plurality of second outlets, wherein the individual mixing recesses have at least one first outlet and at least one second outlet to flow gases from the first and second gas conduits into mixing recess.

49. The system of claim 48 wherein the gas distributor further comprises a plurality of third outlets coupled to a third gas conduit, and wherein the individual mixing recesses have at least one third outlet.

50. A system for depositing material onto a surface of a micro-device workpiece, comprising:
    a gas supply assembly having a first gas source, a second gas source, and a third gas source;
    a reaction chamber coupled to the gas supply assembly;
    a workpiece support in the reaction chamber; and
    a gas distributor in the reaction chamber, the gas distributor comprising a shower head, a first inlet configured for attachment to the first gas source, a second inlet configured for attachment to the second gas source, a third inlet configured for attachment to the third gas source, at least one first outlet in fluid communication with the first inlet, at least one second outlet in fluid communication with the second inlet, at least one third outlet in fluid communication with the third inlet, and an external flow mixer that mixes a first flow from the first outlet and a second flow from the second outlet along a bottom side of the gas distributor facing the workpiece support.

51. The system of claim 50 wherein the external flow mixer comprises a mixing recess.

52. A reactor for depositing material onto a micro-device workpiece, comprising:
    a reaction chamber; and
    a gas distributor in the reaction chamber, the gas distributor including (a) a shower head with a perimeter portion and a center portion, (b) a first gas conduit having a first injector at the perimeter portion and a second injector at the center portion, and (c) a second gas conduit having a third injector at the perimeter portion and a fourth injector at the center portion, where the first and/or second injector projects a first gas flow along a first vector, and wherein the third and/or fourth injector projects a second gas flow along a second vector transverse to the first vector.

53. A reactor for depositing material onto a micro-device workpiece, comprising:
    a reaction chamber; and
    a gas distributor in the reaction chamber, the gas distributor including a shower head, a first gas conduit having a plurality of first injectors in the shower head, a second gas conduit having a plurality of second injectors in the shower head, and a plurality of mixing zones between the shower head and the workpiece, wherein at least one first injector projects a first gas along a first vector into the individual mixing zones, wherein at least one second injector projects a second gas along a second vector into the individual mixing zones, and wherein the first vector is transverse to the second vector.

54. A reactor for depositing material onto a micro-device workpiece, comprising:
    a reaction chamber; and
    a gas distributor in the reaction chamber, the gas distributor comprising a first gas conduit having a first injector and a second gas conduit having a second injector, wherein the first injector projects a first gas flow into a mixing zone, the second injector projects a second gas flow into mixing zone, and wherein the first and second injectors are positioned to induce a vortex in the mixing zone.

* * * * *

UNITED STATES PATENT AND TRADEMARK OFFICE
CERTIFICATE OF CORRECTION

PATENT NO. : 6,884,296 B2
DATED : April 26, 2005
INVENTOR(S) : Cem Basceri et al.

It is certified that error appears in the above-identified patent and that said Letters Patent is hereby corrected as shown below:

Column 12,
Line 15, "alone" should be -- along --;
Line 52, "chamber:" should be -- chamber; --.

Signed and Sealed this

Twenty-third Day of August, 2005

JON W. DUDAS
*Director of the United States Patent and Trademark Office*